US011181819B2

(12) United States Patent
Tavakkoli Kermani Ghariehali et al.

(10) Patent No.: US 11,181,819 B2
(45) Date of Patent: Nov. 23, 2021

(54) FRAME CURING METHOD FOR EXTRUSION CONTROL

(71) Applicant: CANON KABUSHIKI KAISHA, Tokyo (JP)

(72) Inventors: Amir Tavakkoli Kermani Ghariehali, Austin, TX (US); Mehul N. Patel, Austin, TX (US); Edward Brian Fletcher, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 117 days.

(21) Appl. No.: 16/428,166

(22) Filed: May 31, 2019

(65) Prior Publication Data

US 2020/0379342 A1 Dec. 3, 2020

(51) Int. Cl.
*G03F 7/00* (2006.01)
*B82Y 30/00* (2011.01)
*B82Y 40/00* (2011.01)

(52) U.S. Cl.
CPC ............ *G03F 7/0002* (2013.01); *B82Y 30/00* (2013.01); *B82Y 40/00* (2013.01)

(58) Field of Classification Search
CPC .................................................... G03F 7/0002
See application file for complete search history.

(56) References Cited

U.S. PATENT DOCUMENTS

| 6,936,194 | B2 | 8/2005 | Watts |
| 7,157,036 | B2 | 1/2007 | Choi et al. |
| 8,066,930 | B2 | 11/2011 | Sreenivasan et al. |
| 8,076,386 | B2 | 12/2011 | Xu et al. |
| 8,349,241 | B2 | 1/2013 | Sreenivasan et al. |
| 8,641,958 | B2 | 2/2014 | Khusnatdinov et al. |
| 2003/0138704 | A1 | 7/2003 | Mei et al. |
| 2005/0212156 | A1 | 9/2005 | Tokita et al. |
| 2008/0303187 | A1 | 12/2008 | Stacey et al. |
| 2009/0224436 | A1 | 9/2009 | Mikami et al. |
| 2011/0273684 | A1 | 11/2011 | Owa et al. |
| 2013/0078820 | A1* | 3/2013 | Mikami ............. H01L 21/6715 438/778 |
| 2013/0078821 | A1 | 3/2013 | Furutono |

(Continued)

FOREIGN PATENT DOCUMENTS

| JP | 2009-212449 A | 9/2009 |
| JP | 2011-181548 A | 9/2011 |

(Continued)

*Primary Examiner* — Nathan H Empie
(74) *Attorney, Agent, or Firm* — Daniel Ratoff

(57) ABSTRACT

Systems and methods for shaping a film by: depositing a formable material on a field of a substrate; and positioning a template relative to the field. The template has a mesa with a shaping surface and mesa sidewalls surround the shaping surface. The shaping may further comprise contacting the formable material with the shaping surface. The formable material may spread when the shaping surface is in contact with the formable material. The shaping may comprise exposing the formable material to a curing dose of actinic radiation after the formable material has spread to the edge of the field. A spatial distribution of the curing dose may be such that an interior dose applied at an interior of the field may be greater than a sidewall dose that is incident on the mesa sidewalls.

10 Claims, 14 Drawing Sheets

(56) References Cited

U.S. PATENT DOCUMENTS

| | | | |
|---|---|---|---|
| 2013/0214453 A1* | 8/2013 | Umekawa | G03F 7/0002 |
| | | | 264/293 |
| 2014/0213058 A1* | 7/2014 | Matsunaga | G03F 7/0002 |
| | | | 438/694 |
| 2014/0272174 A1 | 9/2014 | Furutono | |
| 2014/0340660 A1 | 11/2014 | Suzuki et al. | |
| 2015/0118847 A1 | 4/2015 | Mikami | |
| 2015/0221501 A1* | 8/2015 | Tsuji | G03F 7/0002 |
| | | | 264/447 |
| 2016/0136872 A1 | 5/2016 | Yanagisawa | |
| 2016/0366769 A1* | 12/2016 | Honma | H05K 3/30 |
| 2018/0067392 A1 | 3/2018 | Murasato | |
| 2018/0174857 A1 | 6/2018 | Kitayama | |

FOREIGN PATENT DOCUMENTS

| | | |
|---|---|---|
| JP | 2011-235571 A | 11/2011 |
| JP | 2013-110196 A | 6/2013 |
| JP | 2014-188869 A | 10/2014 |
| JP | 2015-106670 A | 6/2015 |
| JP | 2016-058735 A | 4/2016 |
| JP | 2017-147283 A | 8/2017 |
| JP | 2018-82127 A | 5/2018 |
| JP | 2018-133378 A | 8/2018 |
| WO | 2019/065250 A1 | 4/2019 |
| WO | 2019/078060 A1 | 4/2019 |

\* cited by examiner

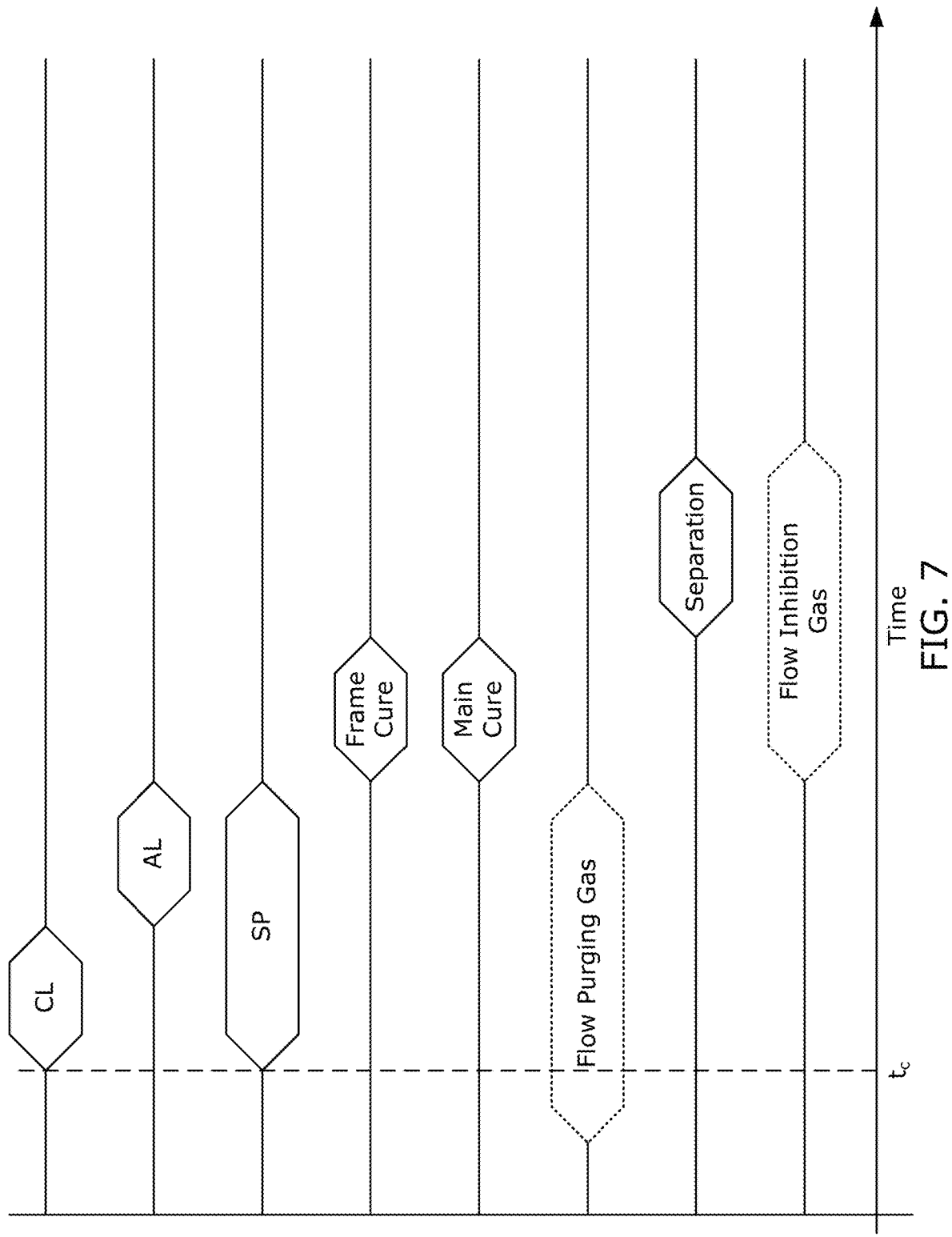

FRAME CURING METHOD FOR EXTRUSION CONTROL

BACKGROUND

Field of Art

The present disclosure relates to systems and methods of using frame curing to control extrusion.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

A first embodiment, may be a method of shaping a film. The method may comprise depositing a formable material on a field of a substrate. The method may further comprise positioning a template relative to the field. The template may have a mesa with a shaping surface and mesa sidewalls surround the shaping surface. The method may comprise contacting the formable material with the shaping surface. The formable material may spread when the shaping surface is in contact with the formable material. The method may comprise exposing the formable material to a curing dose of actinic radiation after the formable material has spread to the edge of the field. A spatial distribution of the curing dose may be such that an interior dose applied at an interior of the field may be greater than a sidewall dose that is incident on the mesa sidewalls.

In an aspect of the first embodiment, the curing dose may be supplied by: a main curing source that supplies actinic energy to the interior of the imprint field; and a frame curing source that supplies actinic energy to a perimeter of the field.

In an aspect of the first embodiment, the frame curing source may be configured to produce an intensity distribution having a 10% of peak intensity as measured at the shaping surface that is positioned at an inset distance $\Delta x$ from the mesa sidewall, wherein the inset distance is 1-60 μm.

In an aspect of the first embodiment, the formable material may be exposed to actinic radiation after the formable material has spread beyond the mesa sidewalls.

In an aspect of the first embodiment, the spatial distribution of the curing dose may be such that formable material on the substrate that has spread beyond edges of the field as defined by the mesa sidewalls of the template and the spatial distribution of the curing dose at the mesa sidewalls is insufficient to cure the formable material on the mesa sidewalls.

In an aspect of the first embodiment, the formable material may include a polymerization inhibitor that inhibits the polymerization of portions of the formable material.

In an aspect of the first embodiment, the polymerization inhibitor may not inhibit polymerization while the formable material is in the presence of a purging gas and may inhibit polymerization while the formable material is in the presence of an inhibition gas.

In an aspect of the first embodiment, the purging gas may be helium and the inhibition gas may contain oxygen.

The first embodiment, may further comprise flowing the purging gas between the shaping surface of the template prior to the shaping surface contacting the formable material and one of reducing and stopping the flow of the purging gas prior to exposing the formable material to the curing dose of the actinic radiation.

The first embodiment, may further comprise flowing the purging gas between the shaping surface of the template prior to the shaping surface contacting the formable material and one of reducing and stopping the flow of the purging gas after a portion of the formable material has reached the edge of the field.

In an aspect of the first embodiment, the interior dose maybe sufficient to cure the formable material; and the sidewall dose maybe insufficient to cure the formable material on the mesa sidewalls.

A second embodiment, may be a system for shaping a film. The system may comprise a template chuck configured to hold a template. The template may have a mesa with a shaping surface and mesa sidewalls surrounding the shaping surface. The system may further comprise a substrate chuck configured to hold a substrate. The system may further comprise a fluid dispenser configured to deposit formable material on a field of the substrate. The system may further comprise a positioning system configured to contact the formable material with the shaping surface. The formable material may spread when the shaping surface is in contact with the formable material. The system may further comprise a curing system configured to expose the formable material to a curing dose of actinic radiation after the formable material has spread beyond the field. A spatial distribution of the curing dose may be such that an interior dose applied at an interior of the field may be greater than a sidewall dose that is incident on the mesa sidewalls.

In an aspect of the second embodiment, the curing system may comprise: a main curing source that supplies actinic energy to the interior of the imprint field; and a frame curing source that supplies actinic energy to a perimeter of the field.

In an aspect of the second embodiment, the frame curing source may be configured to produce an intensity distribution having a 10% of peak intensity as measured at the shaping surface that is positioned at an inset distance $\Delta x$ from the mesa sidewall, wherein the inset distance is 1-60 µm.

In an aspect of the second embodiment, the formable material may be exposed to actinic radiation after the formable material has spread beyond the mesa sidewalls.

In an aspect of the second embodiment, the spatial distribution of the curing dose may be such that formable material on the substrate that has spread beyond edges of the field as defined by the mesa sidewalls of the template and the spatial distribution of the curing dose at the mesa sidewalls may be insufficient to cure the formable material on the mesa sidewalls.

In an aspect of the second embodiment, the formable material may include a polymerization inhibitor that inhibits the polymerization of portions of the formable material.

In an aspect of the second embodiment, the polymerization inhibitor may not inhibit polymerization while the formable material is in the presence of a purging gas and may inhibit polymerization while the formable material is in the presence of an inhibition gas.

In an aspect of the second embodiment, the purging gas may be helium and the inhibition gas may contain oxygen.

The second embodiment, may further comprise an imprint field atmosphere control system configured to control flow of the purging gas between the shaping surface of the template prior to the shaping surface contacting the formable material. The imprint field atmosphere control system may be further configured to, prior to exposing the formable material to the curing dose of the actinic radiation, one of: reducing the flow of the purging gas; and stopping the flow of the purging gas.

The second embodiment, may further comprise an imprint field atmosphere control system configured to control flow of the purging gas between the shaping surface of the template prior to the shaping surface contacting the formable material. The imprint field atmosphere control system may be further configured to, after a portion of the formable material has reached the edge of the field, one of: reducing the flow of the purging gas; and stopping the flow of the purging gas.

The second embodiment, may further comprise an imprint field atmosphere control system configured to introduce the inhibition gas into a region bounded by at least the mesa sidewalls and the substrate.

A third embodiment, may be a method of manufacturing articles. The method may comprise positioning a template relative to the field. The template may have a mesa with a shaping surface and mesa sidewalls surrounding the shaping surface. The method may further comprise contacting the formable material with the shaping surface. The formable material may spread when the shaping surface is in contact with the formable material. The method may further comprise exposing the formable material to a curing dose of actinic radiation after the formable material has spread beyond the field forming a cured formable material. A spatial distribution of the curing dose may be such that an interior dose applied at an interior of the field may be greater than a sidewall dose that is incident on the mesa sidewalls. The method may further comprise processing the substrate with the cured formable material so as to manufacture the articles.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 7 is an illustration of an exemplary timing diagram that may be used in an exemplary embodiment.

Figure 1:
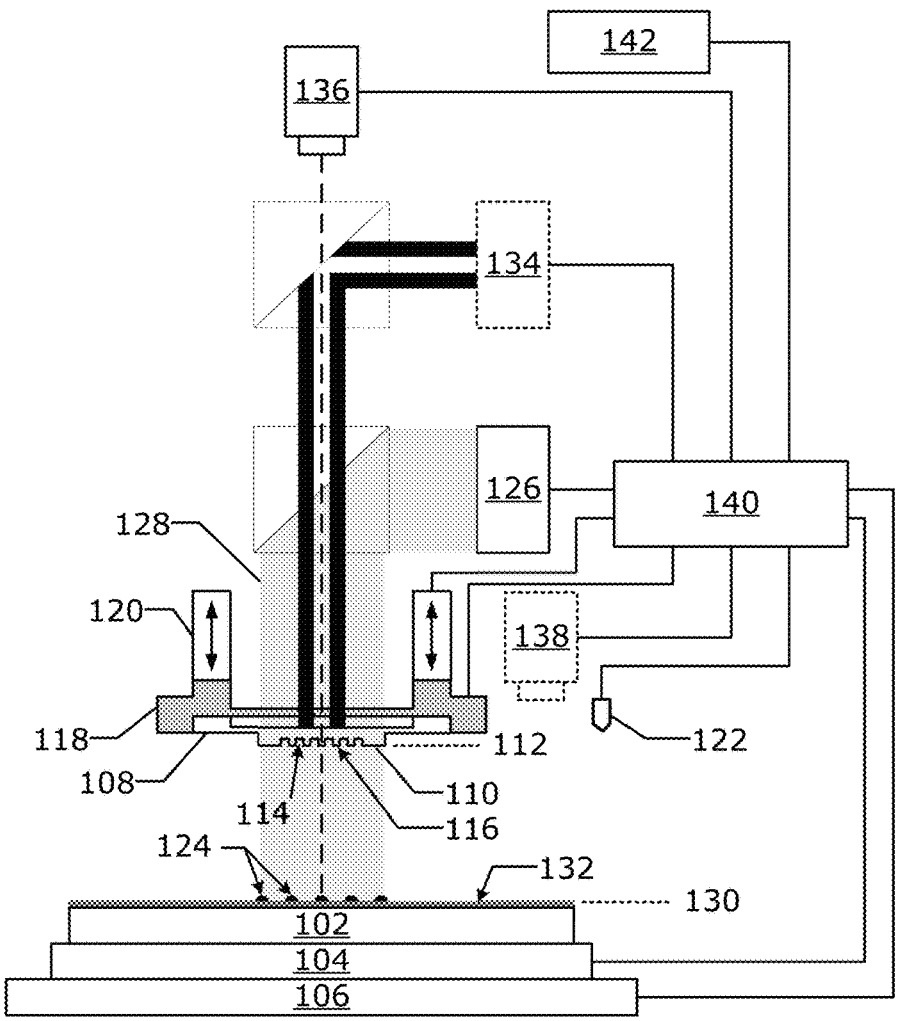
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprinting lithography technique is used to shape a film on a substrate in a formable material. The shaping process includes bringing the template into contact with the formable material. The template includes a shaping surface on a mesa that extends above a recessed surface. The template also includes mesa sidewalls that surround the mesa and connect the mesa to the recessed surface. During the shaping process the formable material spreads due to capillary action and other forces such that the formable material spreads toward the mesa sidewalls during a spreading period. Extrusions form when formable material wets the mesa sidewalls during the shaping process. After the formable material is exposed to actinic radiation, and the template separates from the formable material, one or more extrusions may stay on the substrate and/or template. The applicant has found that it is advantageous to minimize these extrusions. One approach for extrusion minimization is a process that is referred to as frame curing (FC).

Frame curing is a process in which a frame like spatial distribution of actinic radiation is projected towards the edge of an imprint field as the imprinted field is being imprinted during the spreading period. When frame curing is performed during the spreading period the formable material is gelled or partially cured, slowing down the formable material and reducing the propensity for the formable material to form extrusions. Extrusions can start to form once formable material spreads to the mesa sidewalls.

The applicant has found that issues can arise when the spatial distribution of actinic radiation used in the frame curing process does not have a sharp cutoff in the intensity profile along the mesa sidewall. One of these issues is that features and patterns located in regions adjacent to the edges of the imprint field are exposed when it is the edge or a few microns inside the edge that is the target for the actinic radiation. Consequently, there is an increased risk of non-fill in marks and device pattern area because the resist starts to gel before the features have been filled. Another issue is that small extrusions can start to appear on the mesa sidewalls after multiple imprints that cure by actinic radiation that extends beyond the mesa sidewalls.

Nanoimprint System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. The patterning surface 112, also known as a shaping surface, is the surface of the template that shapes the formable material 124. In an embodiment, the patterning surface 112 is planar and is used to planarize the formable material. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track of the imprinting process. The field camera 136 may also be configured to measure interference fringes, which change as the formable material spreads 124 between the gap 451 between the patterning surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system 36 may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form a planar layer with a featureless patterning surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

Figure 2:
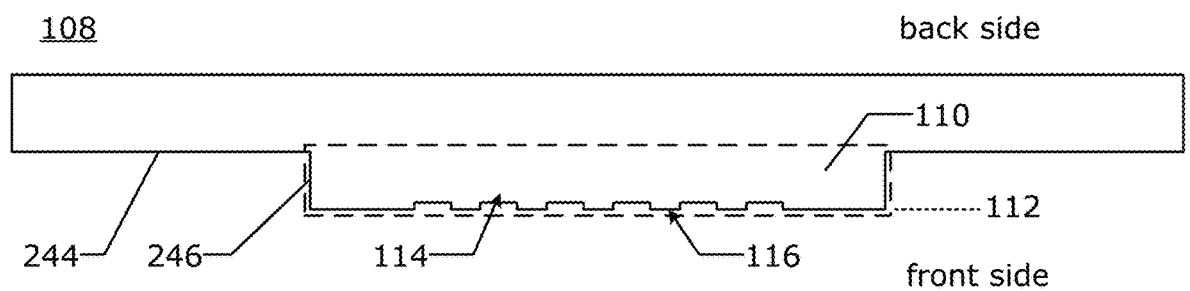
FIG. 2 is an illustration of an exemplary template that may be used in an embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
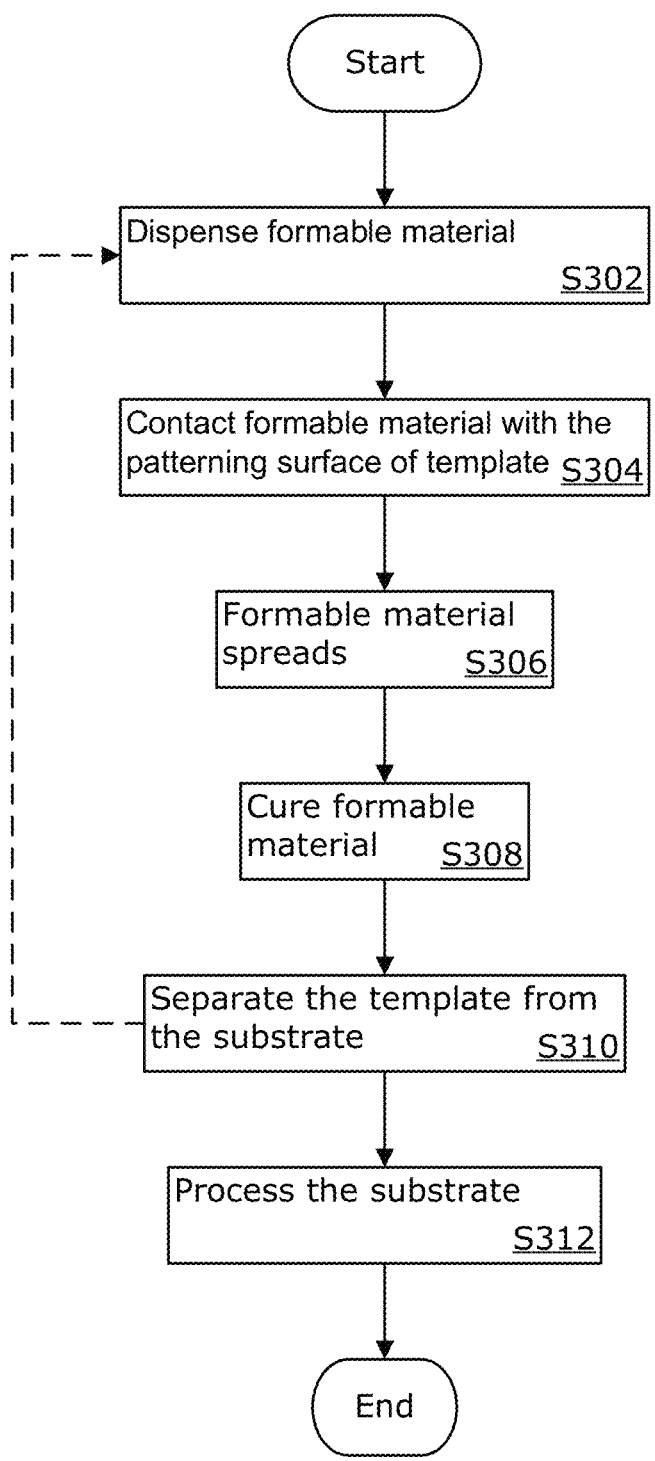
FIG. 3 is a flowchart illustrating an exemplary imprinting method as used in an embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. $\{N \in \mathbb{Z}^{+}\}$. In a dispensing step S302, the processor 140 may cause the fluid dispenser 122 to dispense formable material onto an imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g. semiconductor device). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, packaging, and the like. The substrate 102 may be processed to produce a plurality of articles (devices).

Imprinting Process with Frame Curing that Prevents Extrusions

An embodiment is a film shaping process which can address non-fill and extrusion issues of previous imprinting processes. In an embodiment, an exposure dose is reduced at edges of a field. The applicant has determined that reducing the exposure dose at the edges of the field being imprinted allows uncured extruded material to evaporate and allows features on the edges of the imprint field to be imprinted.

Figure 4:
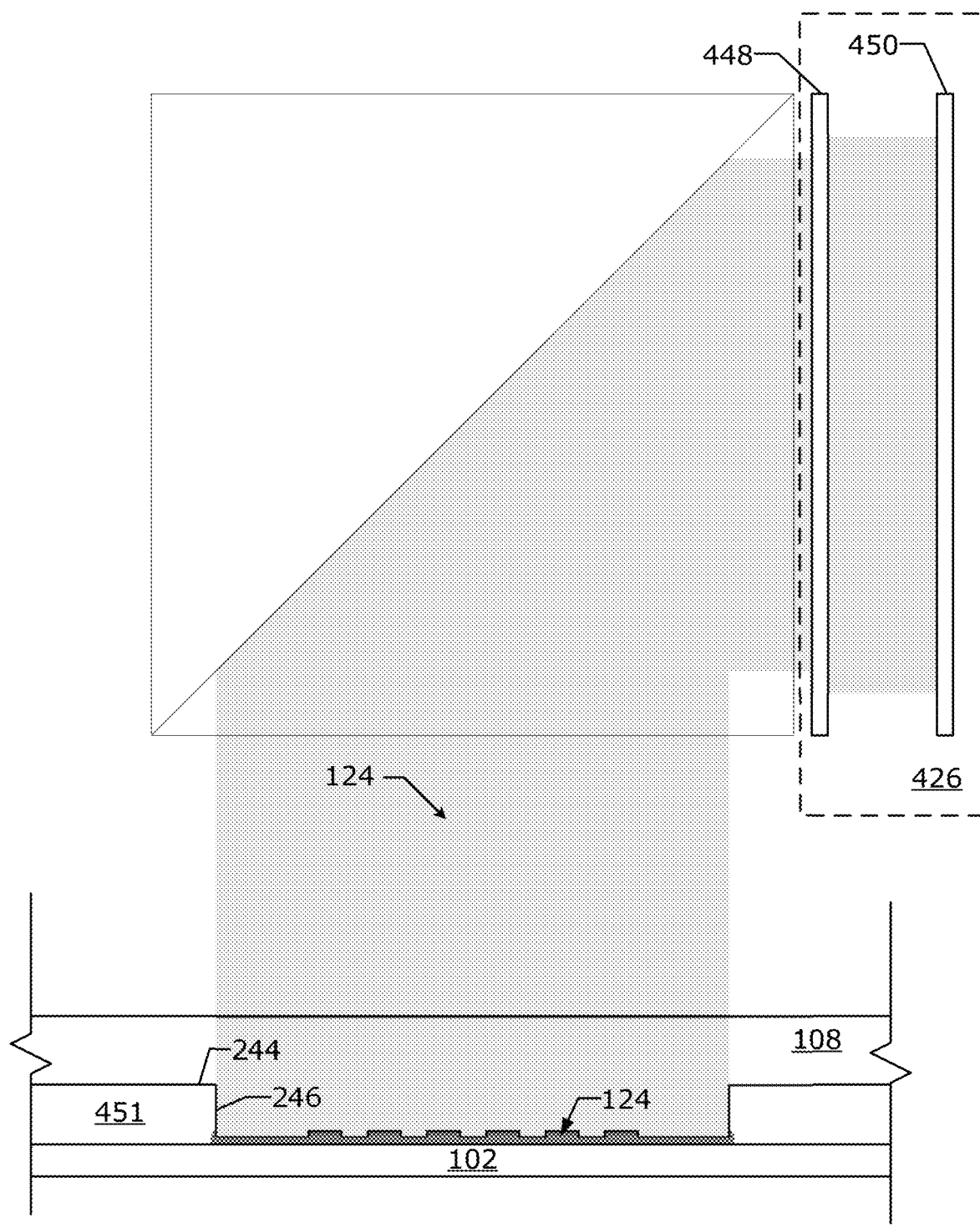
FIG. 4 is an illustration of an arrangement of one or more optical components that may be used in an exemplary embodiment.
Figure 5:
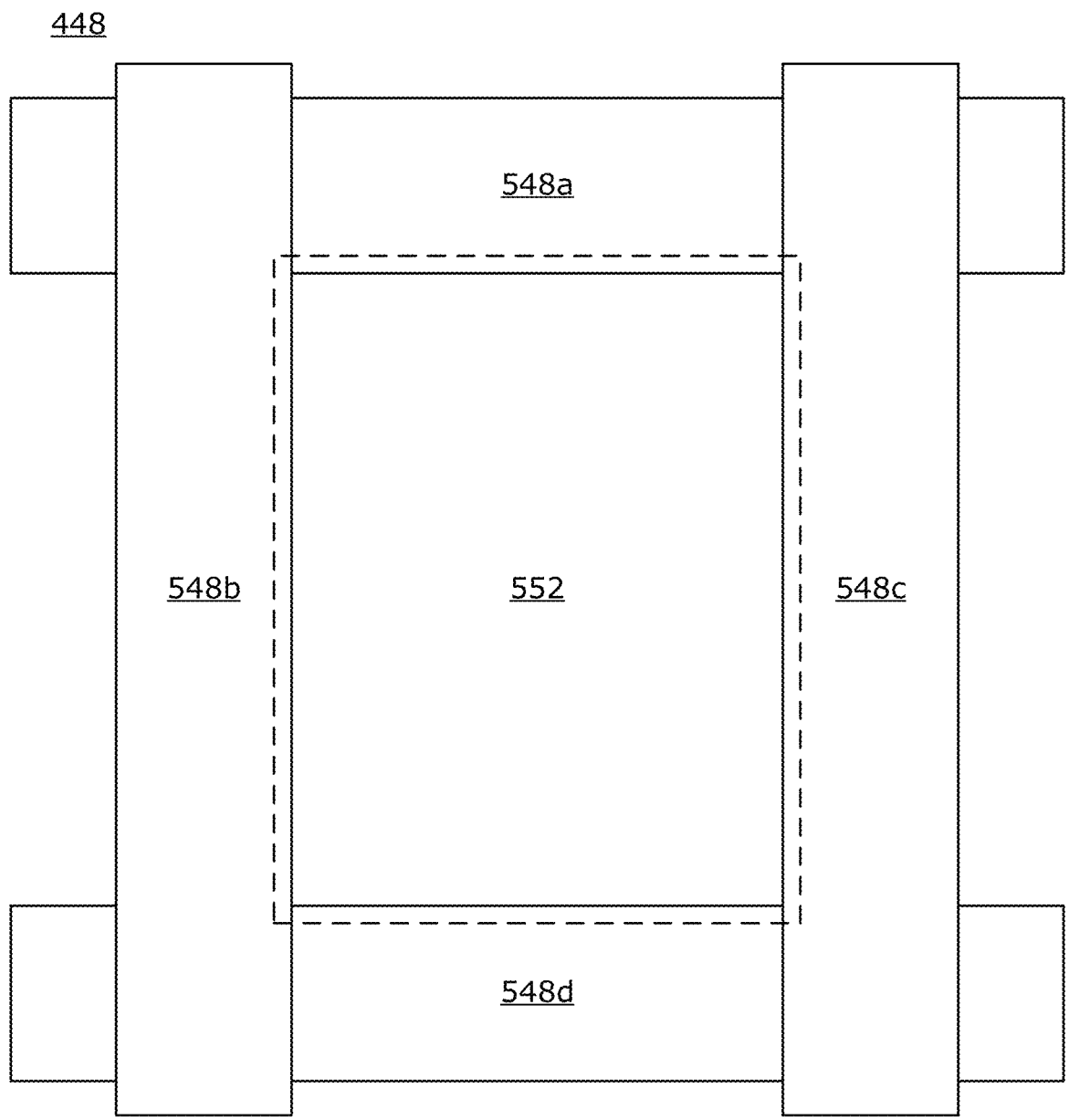
FIG. 5 is an illustration of an aperture that may be used in an exemplary embodiment.

In an embodiment, a radiation source 126 may include an aperture 448 and a main actinic radiation source 450 as illustrated in FIG. 4 near the end of step S306. The main actinic radiation source 450 is a source of actinic radiation and one or more optical components (including aperture 448) which guide actinic radiation to the formable material 124 under the patterning surface 112 of the template 108. The main actinic radiation source 450 may be configured to cure the formable material 124 under the template 108 but not formable material 124 that has spread beyond the mesa sidewalls 246 during the imprinting process 300. The main actinic radiation source 450 may be configured to cure the formable material 124 under the center of the template but not formable material 124 adjacent to or near the edge of the patterning region of the template 108. During step S306, a gap 451 is formed between the recessed surface 244, the mesa sidewall 246, and the substrate 102. The aperture 448 may include a plurality of masking blades 548a-d as illustrated in FIG. 5. The masking blades 548a-d may be positioned relative to an imprint field 552 to reduce the intensity of actinic radiation at the imprint field edges relative to an interior region of the imprint field. In an embodiment, the masking blades 548a-d are positioned such that the intensity of actinic radiation at the mesa sidewalls 246 is below a threshold in which the formable material 124 is cured as illustrated in FIG. 5.

Figure 6A:
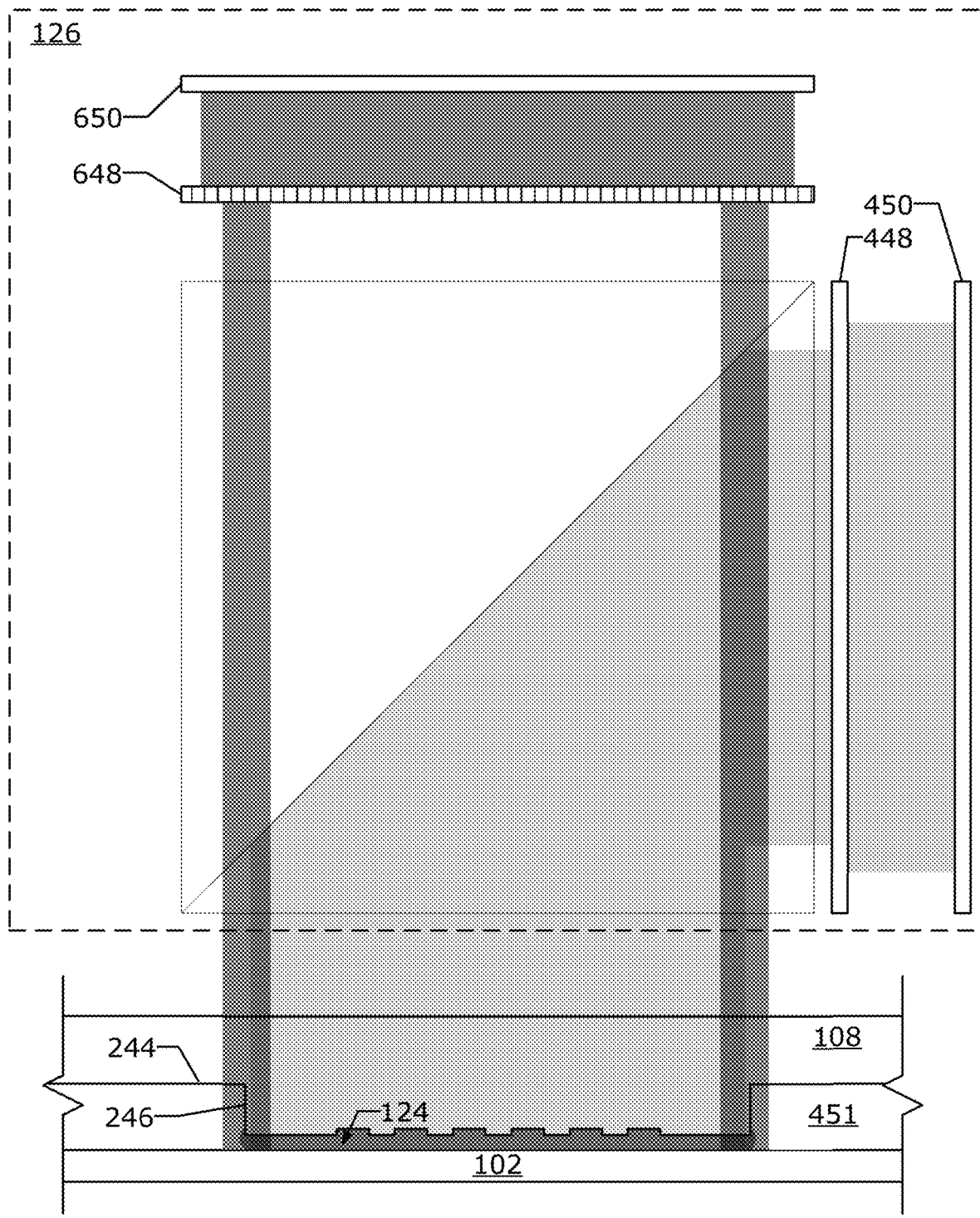
FIG. 6A is an illustration of an arrangement of one or more optical components that may be used in an exemplary embodiment.

In another embodiment, the radiation source 126 includes a main actinic radiation source 450, an optional aperture 448, a secondary light source 650, and a spatial light modulator (SLM) 648 as illustrated in FIG. 6A. The SLM 648 may be a Digital Micromirror Device (DMD), a digital light processor (DLP), an Electrically Addressable Spatial Light Modulator (EASLM), a Liquid Crystal on silicon (LCoS) device, a liquid crystal transmissive modulator, or a spatio-temporal light modulator in which individual elements of the modulator are adjustable in both space and time. The SLM 648 illustrated in FIG. 6A is a transmissive SLM, an individual skilled in the art would understand how to modify the radiation source 126 to use a reflective SLM instead of a transmissive SLM. The radiation source 126 may include one or more apertures, lenses, mirrors, beam combiners, filters, etc. which are used to direct the actinic radiation through the template 108 and into the formable material on the substrate in the imprint field. The SLM 648 includes a plurality of addressable pixels and may be configured to illuminate the template with a frame shaped illumination pattern that intersects with the mesa sidewalls 246 as illustrated in FIG. 6A. The width and shape of the frame shaped illumination pattern can be controlled by controlling individual pixels of the SLM 648.

In an embodiment, the mesa sidewalls 246 are exposed after the formable material 124 has spread to the mesa sidewalls 246 or beyond. In an embodiment, the formable material 124 has spread up to 2 μm beyond the mesa sidewalls 246. In an embodiment, the formable material 124 has spread up to 10 μm beyond the mesa sidewalls 246. In an embodiment, the placement accuracy of the fluid dispenser 122 influences how far the formable material 124 has spread beyond the mesa sidewalls 246. For example, limitations on the scan rate of the fluid dispenser 122 relative to the substrate 102 and the firing rate of the fluid dispenser 122 can limit where droplets can be placed relative to the mesa sidewalls 246 along a first axis, and the pitch of nozzles on the fluid dispenser 122 may limit where droplets can be placed relative to the mesa sidewalls 246 along a second axis.

Figure 6B:
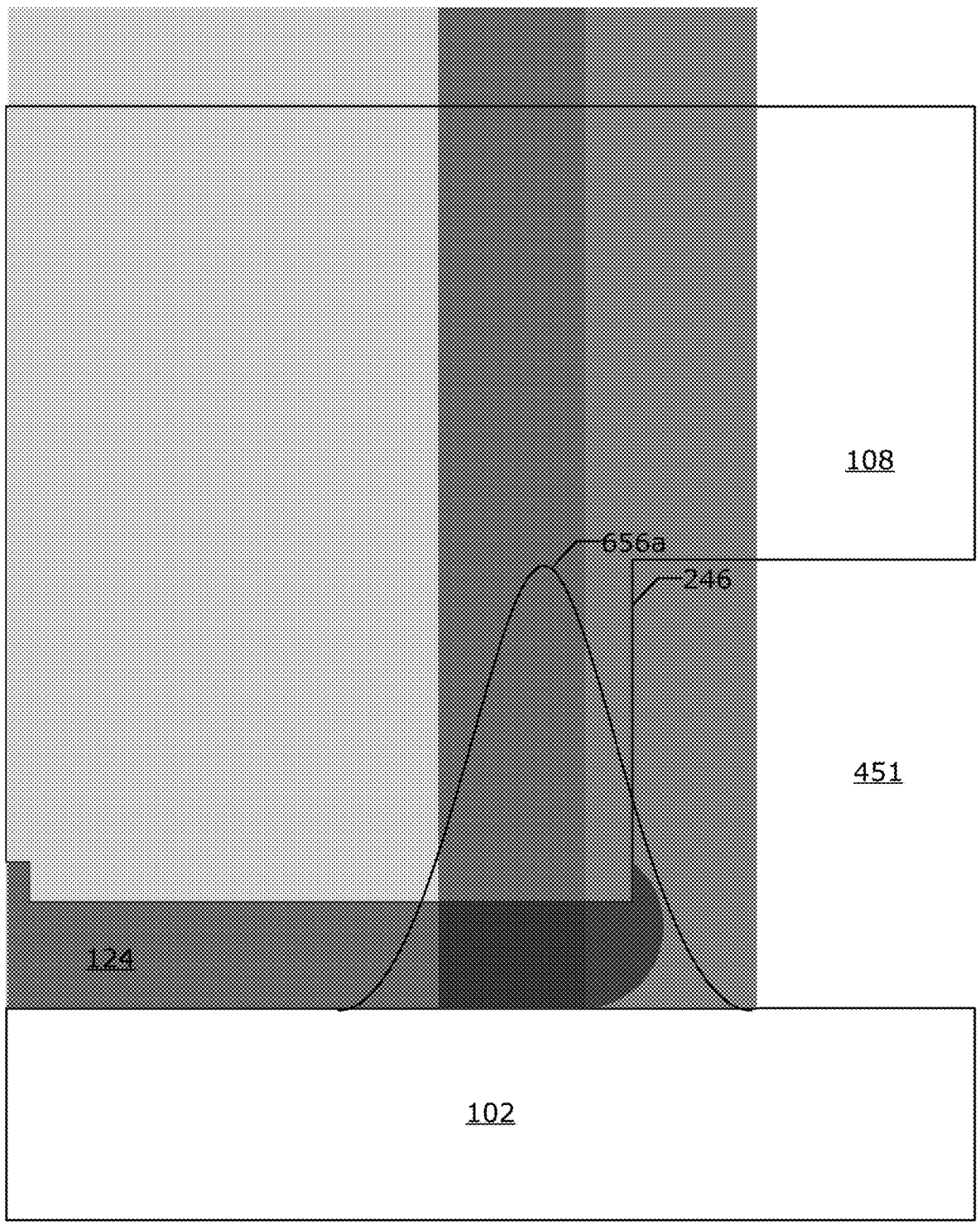
FIGS. 6B-H are illustrations of intensity distributions that may be used in an exemplary embodiment.
Figure 6C:
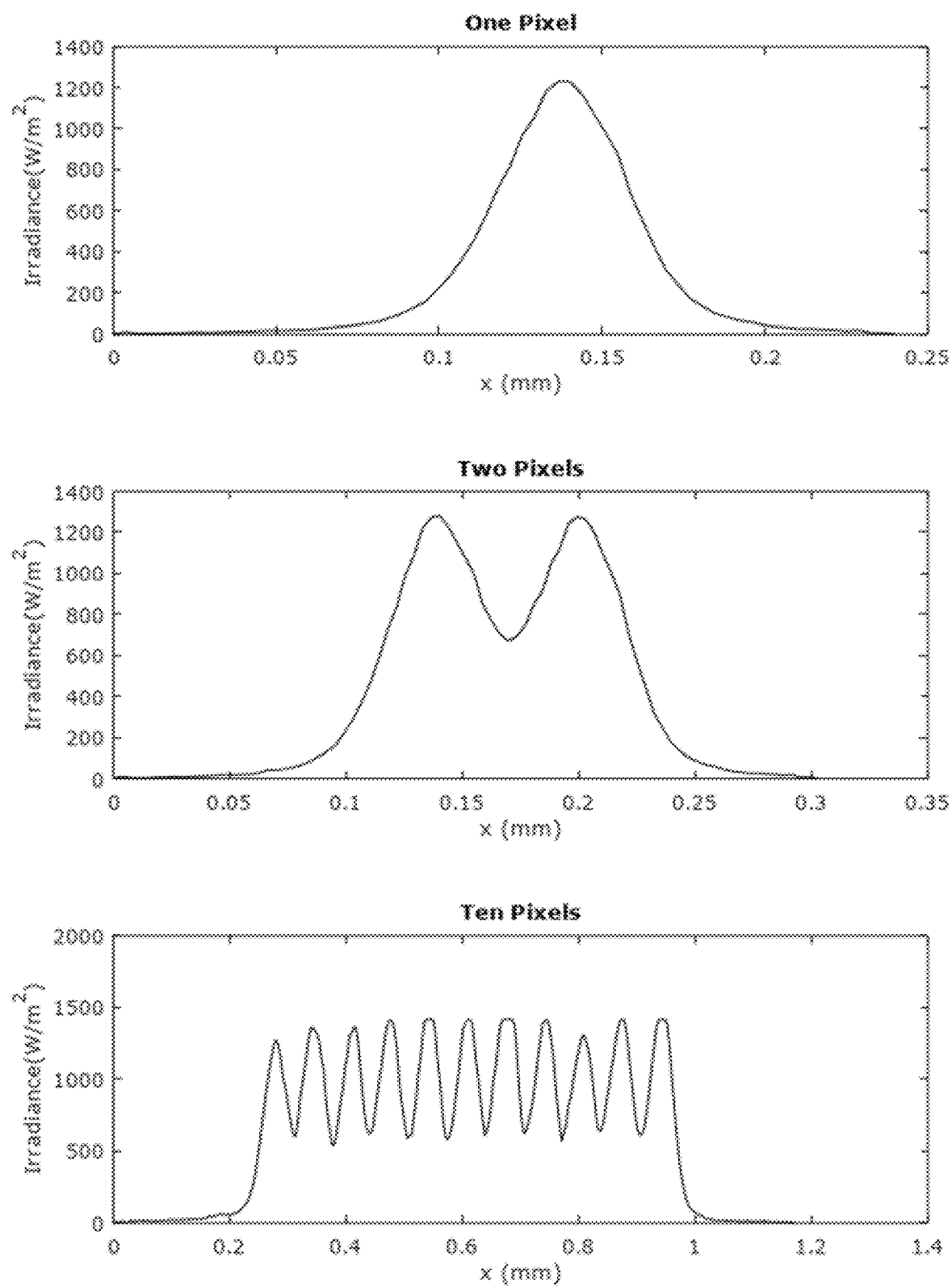

The dose of actinic radiation delivered to the mesa sidewalls 246 can be controlled by the pattern geometry, duration, and/or duty cycle of the SLM 648, and the spatio-temporal intensity and/or wavelength of the secondary light source 650. FIG. 6B is a detail view of a cross section of the nanoimprint lithography system 100 showing the mesa sidewall 246 after the formable material 124 has spread beyond the mesa sidewall 246. FIG. 6B also shows a cross section of a SLM intensity distribution 656a of the actinic radiation output by the SLM 648 and incident near the mesa sidewalls 246. In an embodiment, a tail of the SLM intensity distribution 656a intersects with the mesa sidewalls 246. The SLM 648 is made up of a plurality of addressable pixels. FIG. 6C is an illustration of irradiance profile 656a of cross sections of a 1 pixel wide frame, a 2 pixel wide frame, and a 10 pixel wide frame output by the SLM 648.

Figure 6D:
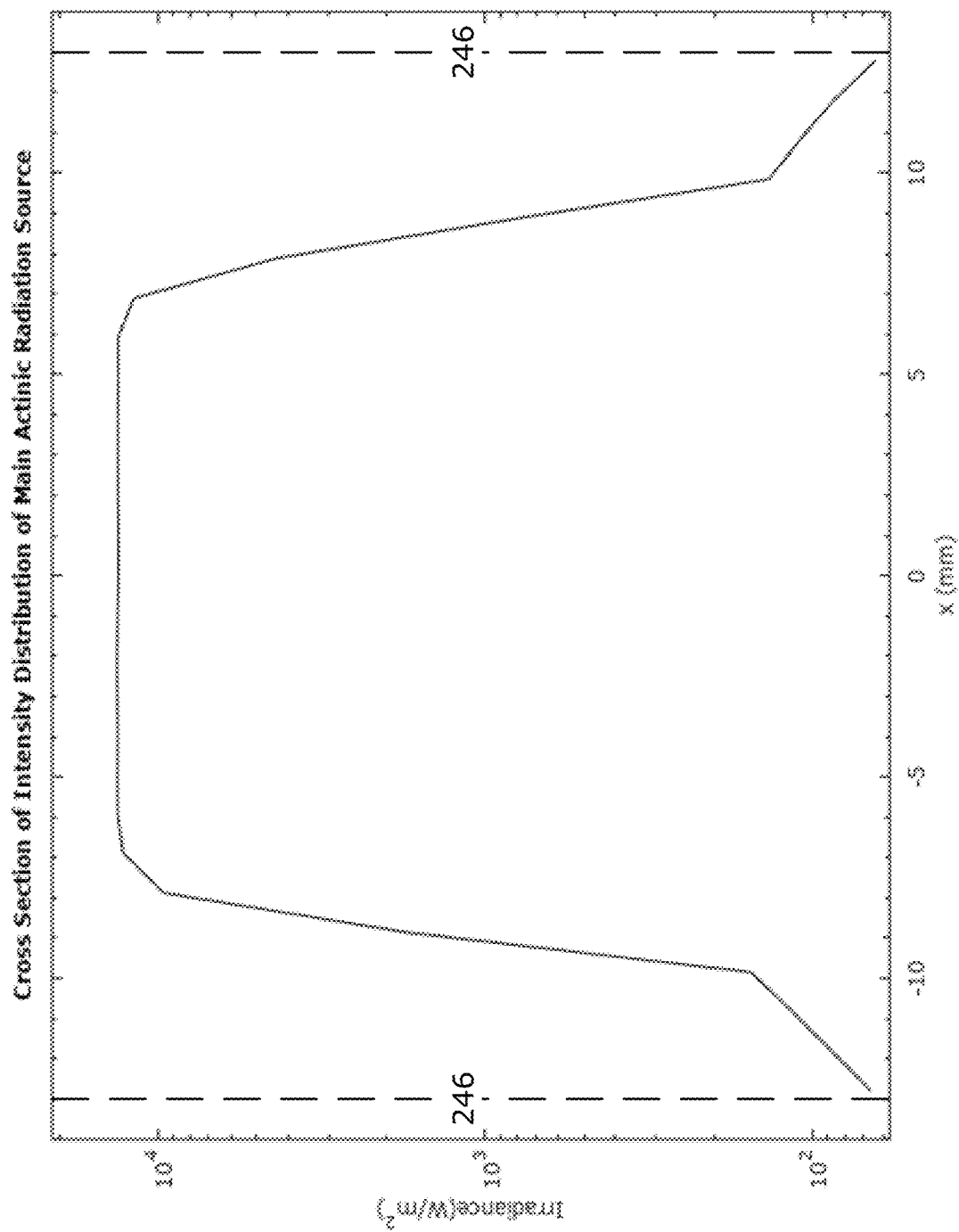
Figure 6E:
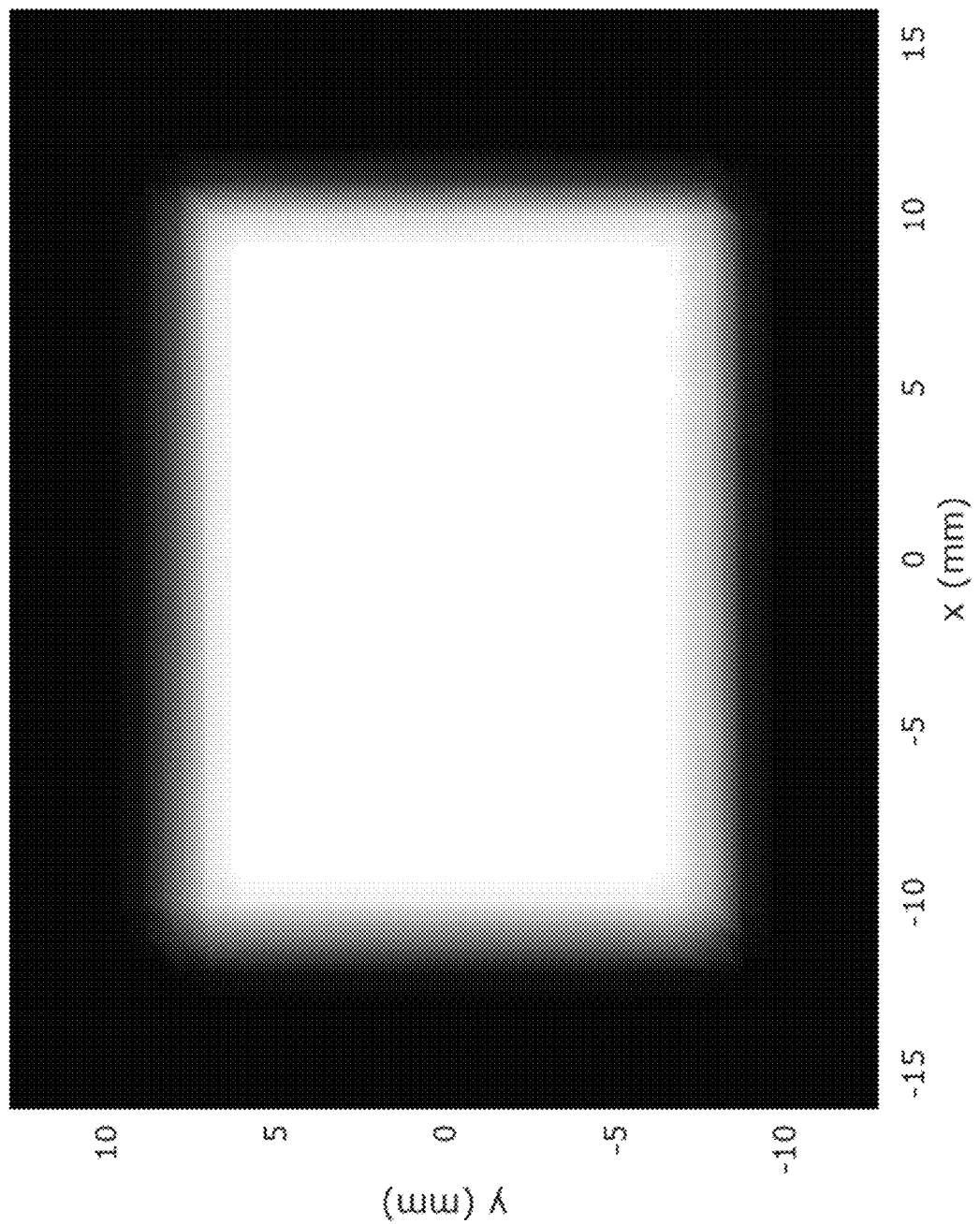
Figure 6F:
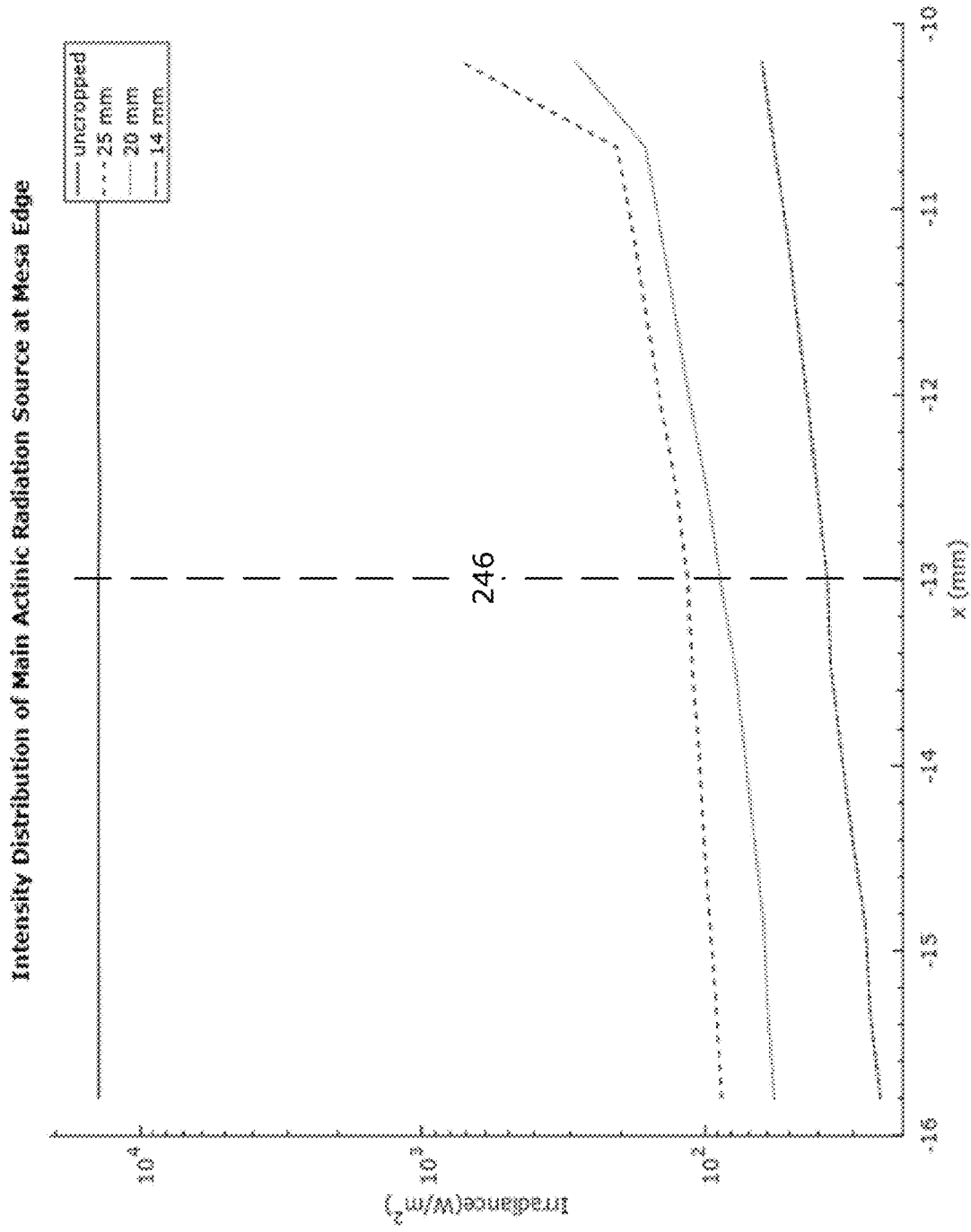
Figure 6G:
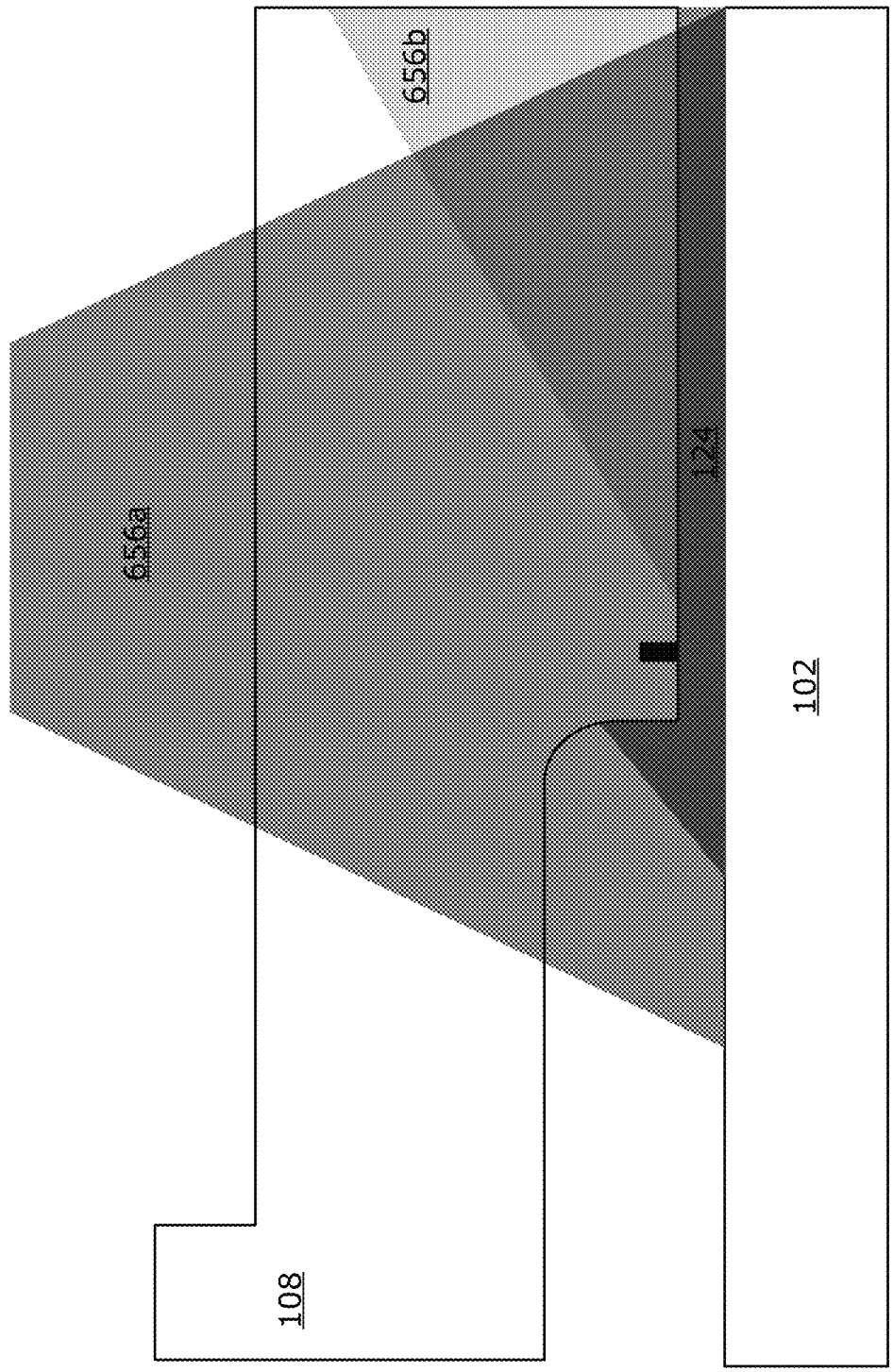

In an embodiment, actinic radiation from the main actinic radiation source 450 is focused and/or cropped so that the intensity is a minimized at the mesa sidewalls 246 as illustrated in FIG. 6G. FIG. 6D is an illustration of a cross section of an intensity distribution of the main actinic radiation source 450 after it has been cropped to reduce the intensity of the actinic radiation at the mesa sidewalls 246. FIG. 6E is an illustration of the intensity distribution of the main actinic radiation source 450 that has been cropped across the entire patterning surface 112. FIG. 6F is an illustration of a main intensity distribution 656b of the actinic radiation source 450 uncropped (solid line) and cropped with a 25 mm aperture, a 20 mm aperture, and a 14 mm aperture, in the region of the mesa sidewall 246. In an embodiment, actinic radiation from the SLM 648 and main actinic radiation source 450 overlap inside the imprint field 552. In an embodiment, the secondary light source 650 has a different wavelength then the main actinic radiation source 450 in which case the beam combiner may be dichroic beam combiner. In an alternative embodiment, off axis illumination from one or both of the main actinic radiation source 450 and the secondary light source 650 are used to illuminate the imprint field 552.

In an embodiment, the wavelength of the main actinic radiation source is in the UV range for example between 240 nm to 450 nm. In an embodiment, the irradiance of the main actinic radiation at the edge of the imprint field is around 200 Watts/meter$^2$. In an embodiment, the radiant exposure (dose) of the main actinic radiation at the edge of the imprint field is less than 40 joules/meter$^2$ which may be less than 2% of the radiation exposure at the center of the imprint field. In an embodiment, the wavelength of the secondary light source may be around 405 nm. In an embodiment, the irradiance of the secondary light source at the edge of the imprint field is around 1000 Watts/meter$^2$. In an embodiment, the radiant exposure (dose) of the secondary light source at the edge of the imprint field is less than 750 joules/meter$^2$. The radiation exposures provided here are for illustrative purposes and will changed depending on the composition of the formable material 124, the wavelengths of the light source(s), and the geometry of the system.

In an embodiment, the position of the tail of the intensity distribution 656a can be adjusted by using different pixels of the SLM 648 to control the width of the frame used to irradiate the formable material near the mesa sidewall as illustrated in FIG. 6C. In an embodiment, the shape of a main intensity distribution 656b produced by the main curing source that is incident on the central portion of the imprint field 552 can be adjusted by changing the position of the masking blades 548a-d as illustrated in FIGS. 6F-H.

In an embodiment, step S308 includes exposing the formable material 124 to a curing dose of actinic radiation after the formable material 124 has reached the edges of the imprint field 552. In an embodiment, a spatial distribution of the curing dose is such that: an interior dose applied at an interior of the imprint field 552 is sufficient to cure the formable material; and a sidewall dose that is incident on the mesa sidewalls is less than the interior dose and is insufficient to cure the formable material on the mesa sidewalls and/or beyond the imprint field on the substrate. In an embodiment, step S308 includes exposing the formable material 124 to actinic radiation after the formable material 124 has spread beyond the mesa sidewalls. In an embodiment, the sidewall dose is less than 2% of the interior dose. In an embodiment, the sidewall dose is less than 10% of the interior dose. In an embodiment, the curing dose is the maximum, median, or average, dosage provided to the interior of the field.

Figure 6H:
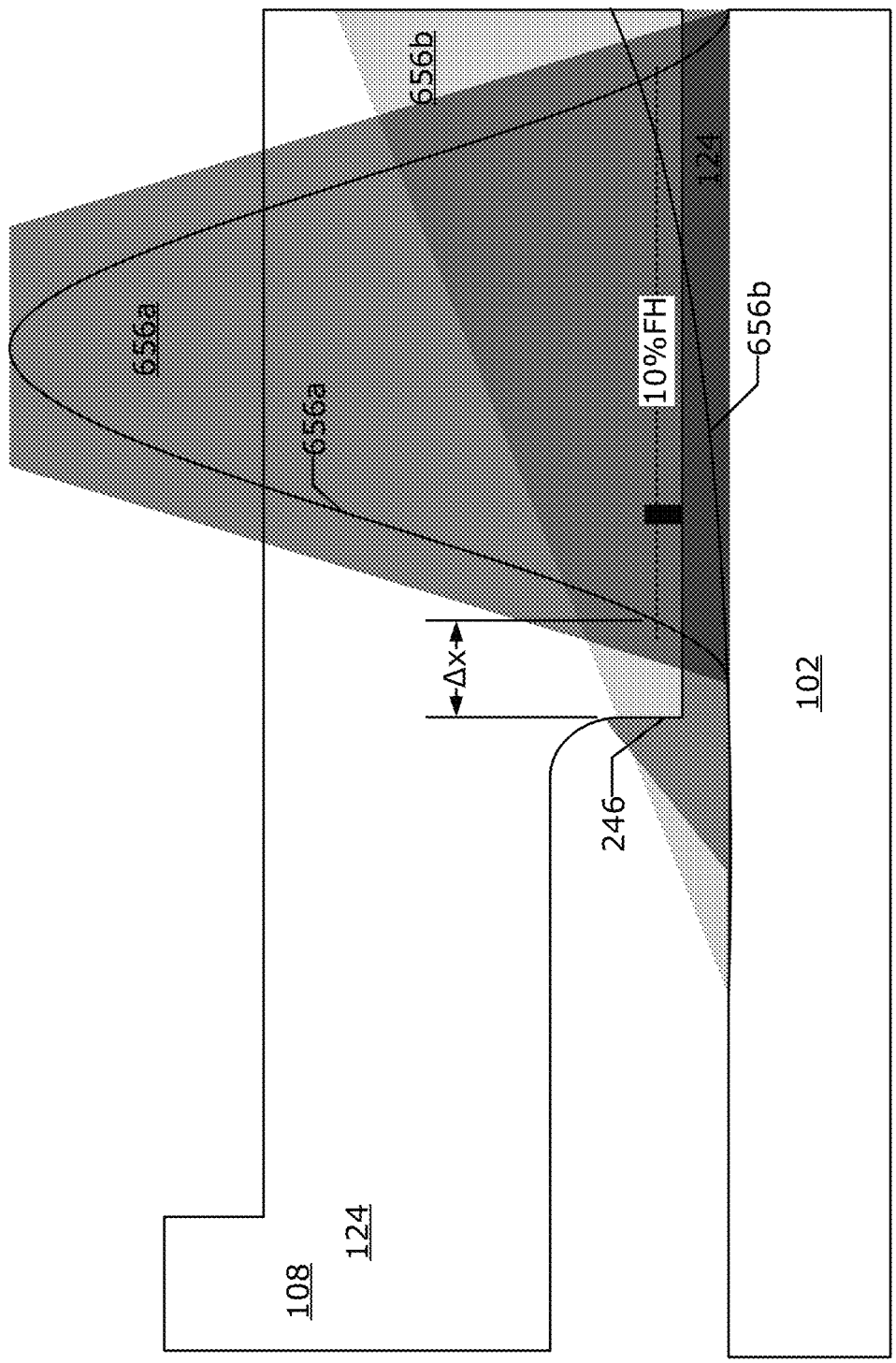

FIG. 6H is an illustration of an embodiment, in which the SLM intensity distribution 656a is inset from the mesa sidewall 246 along with a main intensity distribution 656b that is cropped. In an embodiment, the SLM 648 is configured to produce the SLM intensity distribution 656a, in which 10% of the (peak intensity of the SLM intensity distribution 656a) full height max (10% FH) as measured at the patterning surface 112 is positioned at an inset distance Δx from the mesa sidewall 246. In an embodiment, the inset distance Δx is 1-60 μm.

FIG. 7 is an illustration of an exemplary timing diagram for the imprinting process. At an initial contact time $t_c$, a portion of the patterning surface 112 comes into contact with a portion of the formable material. At the initial contact time $t_c$ the patterning surface 112 is initially curved and then over a contact period CL (400-600 ms) the patterning surface 112 is flattened and conforms with the shape of the substrate surface 130 in the imprinting field. In an embodiment, fine alignment period AL starts after the template has flattened at the end of the contact period CL. In an alternative embodiment, the fine alignment period AL starts before the end of the contact period CL. In an embodiment, the alignment process uses alignment marks on both the template and the substrate to control the position and/or shape of the template and/or substrate.

Starting at initial contact time $t_c$ the formable material starts to spread during a spreading period SP. Prior to the initial contact time $t_c$ a purging gas (e.g. Helium, Neon, etc.) is introduced to the region between the patterning surface 112 and the substrate surface during a purging period as illustrated in FIG. 7 that lasts from prior to the initial contact time $t_c$ and during at least a part of the spreading period SP. In an embodiment, the purging gas is introduced to the region between the patterning surface 112 and the substrate surface through the template or from the edge of the template.

In an embodiment the start of the frame curing exposure is delayed until the end of the spreading period SP as illustrated in FIG. 7. The applicant has found that there is an advantage to delaying the frame curing exposure. This maximizes the time for marks and device patterned areas along the mesa sidewalls 246 to be filled before the formable material 124 undergoes a viscosity increase due to frame cure and also maximizes the time for extrusions to be partially or completely evaporated before exposure to the frame curing radiation. In an embodiment, the center of the patterning surface 112 is also exposed to the cropped main actinic radiation intensity distribution 656b in the main curing period while the edges near the mesa sidewalls 246 are also exposed actinic radiation from both the tail ends of the main actinic radiation intensity distribution 656b and the SLM intensity distribution 656a.

The applicant has determined that a frame curing method as described in the present disclosure can reduce the impact of extrusions if the extrusions are exposed to a flowing gas and allowed to volatize. In an embodiment, formable material 124 that has extruded beyond the mesa sidewalls 246 starts to evaporate. As the formable material 124 evaporates, the partial pressure of the evaporated formable material near the mesa sidewalls 246 approaches the vapor pressure at which point evaporation stops. In an embodiment, the partial pressure of the formable material near the mesa sidewalls 246 is kept below the vapor pressure of the formable in order to have continuous evaporation. In an embodiment, the vapor pressure near the mesa sidewalls 246 is reduced by circulating gas in the gap 451 and/or near the mesa sidewalls 246.

In an embodiment, the formable material 124 is cured when exposed to actinic radiation that is above a curing radiation threshold. While, the formable material 124 exposed to actinic radiation that is below the curing radiation threshold is not completely cured and will volatize.

In an embodiment, the formable material 124 includes one or more materials that interfere with the curing of the formable material in the presence of one or more particular gases. The photocuring process may include one or more chains of chemical reactions. In an embodiment, the reaction rate and/or performance of one or more steps in the photocuring process is changed in the presence of a particular gas (inhibition gas). In an embodiment, at some point in imprinting process after the formable material has started to spread, the formable material 124 near the mesa sidewalls 246 is exposed to a gas which interferes with the curing process.

In an embodiment, the particular gas is oxygen or gas mixture containing oxygen, and oxygen is first purged from the area under the patterning surface 112 prior to imprinting (for example with helium or some other gas is used to displace the oxygen). Sometime after the formable material 124 is contacted by the patterning surface 112 and before or during curing, oxygen is introduced to the gap 451 either near the template edge or near the mesa sidewalls 246 through the template 108. In this embodiment, the formable material 124 includes a polymerization inhibitor that is sensitive to oxygen that interferes and/or terminates polymerization in the presence of oxygen. For example, early chain termination may occur due to the reaction between oxygen and radical molecules which result in incomplete curing. In an embodiment, the polymerization inhibitor is monomethyl ether hydroquinone (MEHQ) which is most effective oxygen has dissolved into the formable material.

The applicant has determined that soon after the patterning surface 112 has contacted the formable material 124 in the imprint field 552, the formable material 124 has completed spreading and has conformed to the substrate 102, the formable material 124 in the interior of the imprint field 552 between the substrate 102 and the template 108 is no longer in contact with gas in the gap 451 outside the imprint field 552 and consequently evaporation no longer occurs in the interior of the imprint field 552. Thus, if an inhibition gas is introduced at the proper time in the imprinting process then the effects of inhibition are limited by the concentration of dissolved inhibition gas in the formable material 124 at the edge of the formable material. The amount of trapped inhibition gas in the formable material 124 can be minimized by flowing a purging gas such as helium before and during the formable material spreading period as illustrated in FIG. 7. In an embodiment, the flow of purging gas is turned off or reduced at a particular time during the imprinting process. This allows ambient gas to diffuse into the gap 451 and reach extrusions at the mesa sidewalls 246. In an embodiment, the ambient gas is an oxygen containing gas such as clean dry air (CDA), air, pure oxygen, etc. In an alternative embodiment, the inhibition gas is introduced into the gap 451 by external nozzles or nozzles in the template to accelerate the inhibition process while the formable material is exposed to actinic radiation and while the template is separating from the formable material as illustrated in FIG. 7.

In an embodiment, the use of an inhibition gas in the gap 451 and polymerization inhibitor in the formable material 124 increases the dose of actinic radiation to gel or cure the formable material 124 at the mesa sidewalls 246 relative to formable material 124 under the patterning surface 112 due to polymerization inhibition.

Figure 8:
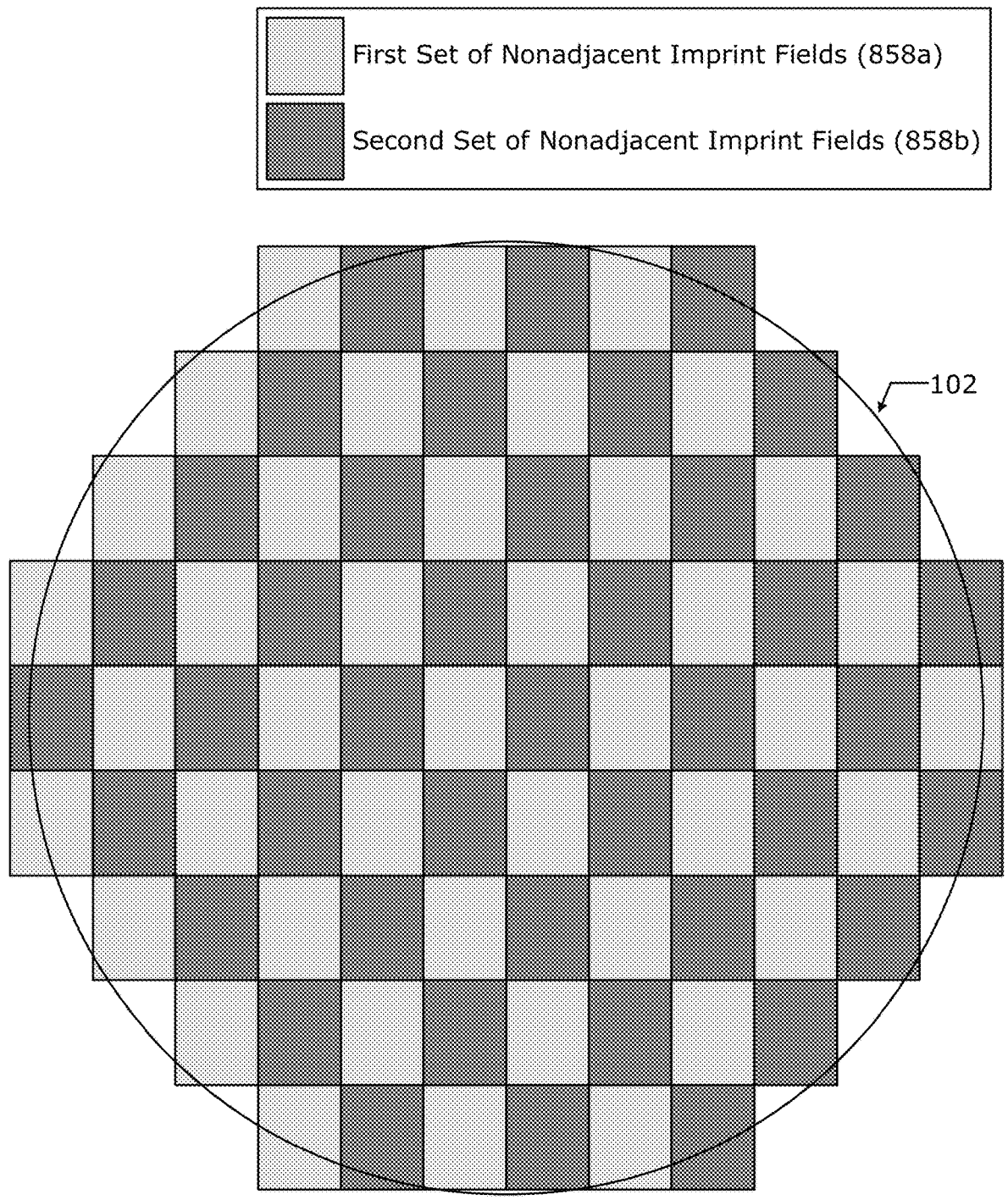
FIG. 8 is an illustration of a grouping of imprint fields as may be used in an exemplary embodiment.

In an embodiment, imprint fields are imprinted in a checker board style as illustrated in FIG. 8. Imprinting with a checker board style allows more time for extrusions on the substrate 102 to evaporate. Imprinting in a checkerboard style would mean dividing imprint fields into at least two subsets of nonadjacent imprint fields. Imprinting the first set of nonadjacent imprint fields 858a and then imprinting a second set of nonadjacent imprint fields 858b in-between the first subset of nonadjacent imprint fields as illustrated in FIG. 8.

In an embodiment, processing the substrate in Step S312 may include exposing all of the imprinted fields to further actinic radiation to change the physical properties of the formable material before additional processing steps. In an embodiment, the dose required at the edge of the imprint field to cure formable material under the patterning surface 112 while allowing the formable material that is in contact with the inhibition gas may depend on several factors including but not limited to: formable material composition; wavelength of the secondary light source 650; wavelength of the main actinic radiation source 450; gas environment in the gap 451, spread time, type of marks or features adjacent to the mesa sidewalls, etc. In an embodiment, the secondary light source 650 is a violet laser with a wavelength of 405 nm. In an embodiment, the secondary light source 650 includes one or more light sources which may be a laser, light emitting diode (LED), or flash lamp. The secondary light source 650 may also include one or more of: optical wavelength dependent filters; diffusers; apertures; mirrors; lenses; windows; shutters; beam combiners; etc. The secondary light source 650 produces actinic radiation which may be violet (380-450 nm) or ultraviolet radiation (10-400 nm).

In an embodiment, formable material 124 is allowed to appear on the mesa sidewalls 246, but due to the low dose of actinic radiation at the mesa sidewalls and the reduced reactivity, the formable material 124 on the mesa sidewalls evaporates after separation of the patterning surface 112 from the imprint field 552 due to the low curing dose. The local gas environment during curing can also encourage formable material evaporation of under-cured (or uncured) formable material on the mesa sidewalls.

In an embodiment, the start of the frame cure exposure is after formation of extrusion. The applicant has also determined that it is preferable to delay the start of frame cure exposure as long as possible to: maximize the filling time for marks and other features near the mesa sidewalls; and maximize the time for extrusions to evaporate before the frame cure exposure begins.

In an embodiment, the main actinic radiation source 450 is focused or cropped with the aperture 448 so that the intensity distribution 656b due to the main actinic radiation source 450 is below a curing threshold at the mesa sidewalls 246.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of shaping a film, comprising:
    depositing a formable material on a field of a substrate;
    positioning a template relative to the field, wherein the template has a mesa with a shaping surface and mesa sidewalls surround the shaping surface;

contacting the formable material with the shaping surface, wherein the formable material spreads when the shaping surface is in contact with the formable material; and exposing the formable material to a curing dose of actinic radiation after the formable material has spread to the edge of the field;

wherein the curing dose is supplied by:
- a main curing source that supplies actinic energy to the interior of the field; and
- a frame curing source that supplies actinic energy to a perimeter of the field, wherein the frame curing source is configured to produce an intensity distribution having a 10% of peak intensity as measured at the shaping surface that is positioned at an inset distance $\Delta x$ from the mesa sidewall, wherein the inset distance is 1-60 µm;

wherein a spatial distribution of the curing dose is such that an interior dose applied at an interior of the field is greater than a sidewall dose that is incident on the mesa sidewalls.

2. The method according to claim 1, wherein the formable material is exposed to actinic radiation after the formable material has spread beyond the mesa sidewalls.

3. The method according to claim 1, wherein while exposing the formable material to the actinic radiation, the formable material on the substrate has spread beyond edges of the field as defined by the mesa sidewalls of the template; and wherein the spatial distribution of the curing dose at the mesa sidewalls is insufficient to cure the formable material on the mesa sidewalls.

4. The method according to claim 1, wherein the formable material includes a polymerization inhibitor that inhibits the polymerization of portions of the formable material.

5. The method according to claim 4, wherein the polymerization inhibitor does not inhibit polymerization while the formable material is in the presence of a purging gas and does inhibit polymerization while the formable material is in the presence of an inhibition gas.

6. The method according to claim 5, wherein the purging gas is helium and the inhibition gas contains oxygen.

7. The method according to claim 5, further comprising flowing the purging gas between the substrate and the shaping surface of the template prior to the shaping surface contacting the formable material and one of reducing and stopping the flow of the purging gas prior to exposing the formable material to the curing dose of the actinic radiation.

8. The method according to claim 5, further comprising flowing the purging gas between the substrate and the shaping surface of the template prior to the shaping surface contacting the formable material and one of reducing and stopping the flow of the purging gas after a portion of the formable material has reached the edge of the field.

9. The method according to claim 1, wherein:
the interior dose is sufficient to cure the formable material; and
the sidewall dose is insufficient to cure the formable material on the mesa sidewalls.

10. A method of manufacturing articles comprising:

positioning a template relative to the field, wherein the template has a mesa with a shaping surface and mesa sidewalls surrounding the shaping surface;

contacting the formable material with the shaping surface, wherein the formable material spreads when the shaping surface is in contact with the formable material;

exposing the formable material to a curing dose of actinic radiation after the formable material has spread beyond the field forming a cured formable material;

wherein the curing dose is supplied by:
- a main curing source that supplies actinic energy to the interior of the field; and
- a frame curing source that supplies actinic energy to a perimeter of the field, wherein the frame curing source is configured to produce an intensity distribution having a 10% of peak intensity as measured at the shaping surface that is positioned at an inset distance $\Delta x$ from the mesa sidewall, wherein the inset distance is 1-60 µm;

wherein a spatial distribution of the curing dose is such that an interior dose applied at an interior of the field is greater than a sidewall dose that is incident on the mesa sidewalls; and processing the substrate with the cured formable material so as to manufacture the articles.

* * * * *